(12) United States Patent
Sakamoto et al.

(10) Patent No.: US 10,841,467 B2
(45) Date of Patent: Nov. 17, 2020

(54) PARTS FOR IMAGING APPARATUS, AND IMAGING APPARATUS

(71) Applicant: IRISO ELECTRONICS CO., LTD., Yokohama (JP)

(72) Inventors: Tetsuma Sakamoto, Yokohama (JP); Jyunya Sakaue, Yokohama (JP); Takashi Sekine, Yokohama (JP)

(73) Assignee: IRISO ELECTRONICS CO., LTD., Yokohama (JP)

( * ) Notice: Subject to any disclaimer, the term of this patent is extended or adjusted under 35 U.S.C. 154(b) by 148 days.

(21) Appl. No.: 16/075,253

(22) PCT Filed: Nov. 15, 2016

(86) PCT No.: PCT/JP2016/083834
§ 371 (c)(1),
(2) Date: Aug. 3, 2018

(87) PCT Pub. No.: WO2017/134895
PCT Pub. Date: Aug. 10, 2017

(65) Prior Publication Data
US 2019/0041600 A1    Feb. 7, 2019

(30) Foreign Application Priority Data

Feb. 5, 2016    (JP) .................. 2016-021157

(51) Int. Cl.
*H04N 5/222*    (2006.01)
*H04N 5/225*    (2006.01)
(Continued)

(52) U.S. Cl.
CPC .......... *H04N 5/22521* (2018.08); *G02B 7/02* (2013.01); *G03B 15/00* (2013.01); *G03B 17/02* (2013.01);
(Continued)

(58) Field of Classification Search
CPC .. H04N 5/22521; H04N 5/2252; H04N 5/225; G03B 15/00; G03B 17/02;
(Continued)

(56) References Cited

U.S. PATENT DOCUMENTS

2011/0199485 A1    8/2011    Nakamura
2011/0298925 A1    12/2011    Inoue et al.
(Continued)

FOREIGN PATENT DOCUMENTS

CN    102162977 A    8/2011
CN    105100561 A    11/2015
(Continued)

OTHER PUBLICATIONS

Extended European Search Report dated Apr. 26, 2019 in corresponding European Patent Application No. 16889378.2.
(Continued)

*Primary Examiner* — William R Alexander
*Assistant Examiner* — Henry A Duong
(74) *Attorney, Agent, or Firm* — Buchanan Ingersoll & Rooney PC (57) ABSTRACT

There is provided an imaging apparatus capable of efficiently dissipating heat generated by an electronic circuit unit and eliminating noise. The imaging apparatus includes a housing 8, which includes an outer frame member 7 and an inner frame member 6 that is made of a metal, a lens unit 3, which is attached to an opening of the housing 8, a substrate 41, on which a heat dissipating wiring line is formed, an electronic circuit unit 4, which is provided in the inner frame member 6, and a fixing member 9, which is made of a metal, is in contact with the heat dissipating metal wiring line 43 in the electronic circuit unit 4 and the inner frame member 6, and fixes the electronic circuit unit 4 to the inner frame member 6. The configuration described above
(Continued)

achieves not only efficient dissipation of the heat from the electronic circuit unit 4 via the heat dissipating metal wiring line 43 and the fixing member 9 to the inner frame member 6 but noise elimination.

4 Claims, 10 Drawing Sheets

(51) Int. Cl.
  *G03B 17/02* (2006.01)
  *H05K 7/20* (2006.01)
  *H05K 9/00* (2006.01)
  *G03B 15/00* (2006.01)
  *G02B 7/02* (2006.01)

(52) U.S. Cl.
  CPC .......... *H04N 5/225* (2013.01); *H04N 5/2252* (2013.01); *H05K 7/20* (2013.01); *H05K 9/00* (2013.01); *H05K 9/0081* (2013.01); *H05K 9/0084* (2013.01)

(58) Field of Classification Search
  CPC ...... H05K 9/00; H05K 9/0084; H05K 9/0081; H05K 7/20; G02B 7/02; G02B 7/007; G02B 7/008; G02B 7/028; G02B 7/102
  USPC .......................................................... 359/820
  See application file for complete search history.

(56) References Cited

U.S. PATENT DOCUMENTS

| | | |
|---|---|---|
| 2013/0293771 A1 | 11/2013 | Mori et al. |
| 2014/0049824 A1 | 2/2014 | Katsuyama et al. |
| 2015/0327377 A1 | 11/2015 | Mano et al. |
| 2017/0129418 A1 | 5/2017 | Koshiba et al. |

FOREIGN PATENT DOCUMENTS

| | | | |
|---|---|---|---|
| EP | 2 393 277 A1 | | 7/2011 |
| JP | 2007022364 A | * | 2/2007 |
| JP | 2007022364 A | | 2/2007 |
| JP | 2011-109225 A | | 6/2011 |
| JP | 2013109188 A | | 6/2013 |
| JP | 2013-210480 A | | 10/2013 |
| JP | 5862225 A | | 2/2016 |
| WO | 2015/198598 A1 | | 12/2015 |

OTHER PUBLICATIONS

International Search Report (PCT/ISA/210) dated Feb. 28, 2017, by the Japanese Patent Office as the International Searching Authority for International Application No. PCT/JP2016/083834.
Written Opinion (PCT/ISA/237) dated Feb. 28, 2017, by the Japanese Patent Office as the International Searching Authority for International Application No. PCT/JP2016/083834.
Office Action (Text First Office Action) dated Jul. 21, 2020, by the State Intellectual Property Office of the People's Republic of China in corresponding Chinese Patent Application No. 201680080992.0 and an English Translation of the Office Action. (12 pages).

* cited by examiner

PARTS FOR IMAGING APPARATUS, AND IMAGING APPARATUS

TECHNICAL FIELD

The present invention relates to an imaging apparatus, and particularly to an imaging apparatus, such as an in-vehicle camera.

BACKGROUND ART

A compact imaging apparatus including a built-in imaging element is used, such as an in-vehicle drive recorder, an in-vehicle camera used to improve visibility of the rear side of the vehicle, and a surveillance camera used for crime prevention in a bank, a shop, and other locations.

For example, Patent Literature 1 discloses an in-vehicle camera apparatus in which internal electronic parts are accommodated in an enclosure-shaped housing made of a resin and formed of a front enclosure section and a rear enclosure section.

In the in-vehicle camera apparatus, the front enclosure section is provided with a lens, and light incident through the lens is focused on an imaging element, such as a charged coupled device (CCD), which is one of the internal electronic parts, to capture an image.

In recent years, however, a compact imaging apparatus is required to increase the high integration of elements in an electronic circuit unit for achieving both high performance and a small size of the imaging apparatus and high-speed transmission of a digital signal to an external apparatus, which have not been required in an imaging apparatus of related art.

CITATION LIST

Patent Literature

Patent Literature 1: Japanese Patent Laid-open No. 2013-210480

SUMMARY OF INVENTION

Technical Problem

As the high integration of elements in an electronic circuit unit increases, the amount of heat generated by the electronic circuit unit increases, and when the heat is accumulated in the imaging apparatus, the electronic circuit unit could malfunction or could be damaged. There is an increasing demand for efficient dissipation of the heat of the electronic circuit unit, but no sufficient measures have been taken to solve the problem with an imaging apparatus of related art.

As for the requirement for high-speed transmission of a digital signal, measures to eliminate EMI (electromagnetic interference), ESD (electrostatic discharge), and other types of noise are required in association with the requirement, but it is hard to say that the measures described above have been sufficiently taken in an imaging apparatus of related art.

Therefore, in a compact imaging apparatus, how effectively heat dissipation and noise elimination are performed is a problem.

The present invention has been made in view of the problem described above, and an object of the present invention is to provide an imaging apparatus capable of efficiently dissipating heat generated by an electronic circuit unit and eliminating noise.

Solution to Problem

To achieve the object described above, the present invention has the following features:

The present invention relates to parts for an imaging apparatus including a housing that accommodates an electronic circuit unit including a substrate on which an imaging element is mounted, the parts for an imaging apparatus are characterized in that the housing includes an outer frame member and an inner frame member made of a metal that is provided on an inner surface of the outer frame member and that accommodates the electronic circuit unit, and the parts for an imaging apparatus further include a fixing member that fixes the electronic circuit unit to the housing with a heat conducting section of the electronic circuit unit being in contact with the inner frame member.

According to the present invention, heat transferred from the heat conducting section of the electronic circuit unit including the substrate, on which the imaging element is mounted, is transmitted to the inner frame member which can effectively transfer the heat, whereby the heat can be dissipated. The heat transferred to the inner frame member can be further transmitted to the outer frame member and dissipated to the atmosphere. The heat in the electronic circuit unit can therefore be effectively dissipated.

Further, according to the present invention, since the electronic circuit unit is covered with the inner frame member made of a metal, the inner frame member can electromagnetically shield the electronic circuit unit and effectively prevent noise generation.

The outer frame member can be made of a resin. With the use of it, a part for an imaging apparatus having lightweight property that cannot be achieved by a diecast body can be provided.

The heat conducting section may be configured as a heat conducting path made of a metal that is provided on the substrate and that is in contact with the imaging element and the inner frame member.

According to the present invention, the heat conducting path made of a metal and provided on the substrate allows thermal connection between the imaging element and the inner frame member via the heat conducting path. The heat conducting path can be provided on the substrate and formed, for example, of a heat dissipating metal wiring line that is in contact with the imaging element, a heat dissipating metal wiring line that is in contact with the inner frame member, and a metal film that links the heat dissipating metal wiring lines to each other. Further, the heat dissipating metal wiring lines can be formed on one surface and the other surface of the substrate on which the imaging element is mounted. The metal film can, for example, be provided on an insertion section (through hole, recess provided at edge of substrate) which is provided in the substrate in the thickness direction of the substrate and into which the fixing member is inserted. Heat dissipating path formed of the heat dissipating metal wiring lines can therefore be readily formed on the substrate with a free layout.

The present invention described above can be configured to include an enclosure section that accommodates an imaging part, a connector section that connects an external conductor to an imaging apparatus, an outer frame member made of a resin and having a barrier wall between the enclosure section and the connector section, and a connector terminal having an inner contact section exposed to the interior of the enclosure section and an outer contact section exposed to the interior of the connector section and further include an enclosure section shielding body formed of a box-shaped metal shell that accommodates the inner contact section in the enclosure section and a connector section shielding body formed of a tubular metal shell that accommodates the outer contact section in the connector section. According to the present invention, the enclosure section shielding body, which is a box-shaped metal shell, can suppress influence of electromagnetic noise on the internal contact section of the connector terminal in the enclosure section. Further, the connector section shielding body, which is a tubular metal shell, can suppress influence of electromagnetic noise on the external contact section of the connector terminal in the connector section which connects an external conductor to the imaging apparatus. A bad influence of the external electromagnetic noise on the connector terminal, which serves as an electrically continuous path, can therefore be avoided. In particular, parts for an imaging apparatus suitable for transmission of a high-frequency signal can be achieved. Further, the enclosure section shielding body, which is a box-shaped metal shell, and the connector section shielding body, which is a tubular metal shell, are components separate from each other and can therefore each be relatively readily manufactured as a press-worked metal thin plate.

The connector section shielding body may include a contact piece that achieves electrically continuous connection with the enclosure section shielding body. The connector section shielding body and the enclosure section shielding body can therefore achieve electrically continuous connection with each other via the contact piece, whereby the achieved electrically continuous path can be used, for example, to ground the imaging part accommodated in the enclosure section. Further, a heat dissipation path can be so formed as to include the enclosure section shielding body, which accommodates the heat-generating imaging part, and the connector section shielding body connected to each other via the contact piece, whereby heat of the enclosure section shielding body can be dissipated with increased efficiency.

The contact piece may be a spring piece that achieves pressing contact with the enclosure section shielding body. The contact piece, which is formed of a spring piece, therefore achieves pressing contact with the enclosure section shielding body with the aid of the resilient force produced by the spring piece. Therefore, even if the enclosure section shielding body and the connector section shielding body are each positionally shifted and attached, the contact piece formed of a spring piece can absorb the positional shift to achieve pressing contact with the enclosure section shielding body. Further, no soldering step or any other step is required to achieve the electrically continuous connection between the contact piece and the enclosure section shielding body, whereby reliable electrically continuous connection can be achieved by attaching the enclosure section shielding body and the connector section shielding body to a housing.

The enclosure section shielding body may include a circumferential wall section disposed on an inner circumferential surface of a tubular circumferential wall that forms the enclosure section and a bottom wall section disposed on a wall surface that forms the barrier wall and faces the enclosure section. The circumferential wall section and the bottom wall section of the enclosure section shielding body can therefore reliably shield the internal space formed by the enclosure section and the barrier wall against electromagnetic waves.

The connector section shielding body may include a tubular main body that passes through the barrier wall from the interior of the connector section and protrudes into the interior of the enclosure section shielding body. The thus configured tubular main body can reliably and seamlessly shield the electrically continuous path of the connector terminal from the interior of the connector section though the barrier wall to the interior of the enclosure section shielding body.

The connector section shielding body may accommodate the connector terminal and a terminal holder that is made of a resin material and holds the connector terminal. Since an in-shield connector section including the connector terminal described above and the terminal holder that holds the connector terminal is provided in the connector section shielding body, the connector section shielding body can reliably shield the connector terminal, which forms the electrically continuous path. Further, providing the in-shield connector section in the connector section shielding body allows the in-shield connector section and the connector section shielding body to be handled as an integrated component, that is, a part, whereby the two components can be readily handled in the steps of manufacturing the imaging apparatus.

The connector section shielding body may include a locking section that protrudes from an outer surface of the connector section shielding body and is locked by the outer frame member. The locking section of the connector section shielding body can therefore maintain the correct state in which the connector section shielding body is attached to the outer frame member.

The present invention provides an imaging apparatus including any of the parts for an imaging apparatus described above. Therefore, since heat can be transmitted from the electronic circuit unit via the fixing member made of a metal to the inner frame member made of a metal, an imaging apparatus that excels in heat dissipation can be achieved. Further, the inner frame member made of a metal can electromagnetically shield the electronic circuit unit.

Advantageous Effects of Invention

The present invention achieves an imaging apparatus part and an imaging apparatus that excel in dissipation of heat in an electronic circuit unit and provide electromagnetic shielding that allows transmission of a high-frequency signal.

DESCRIPTION OF EMBODIMENTS

Figure 1:
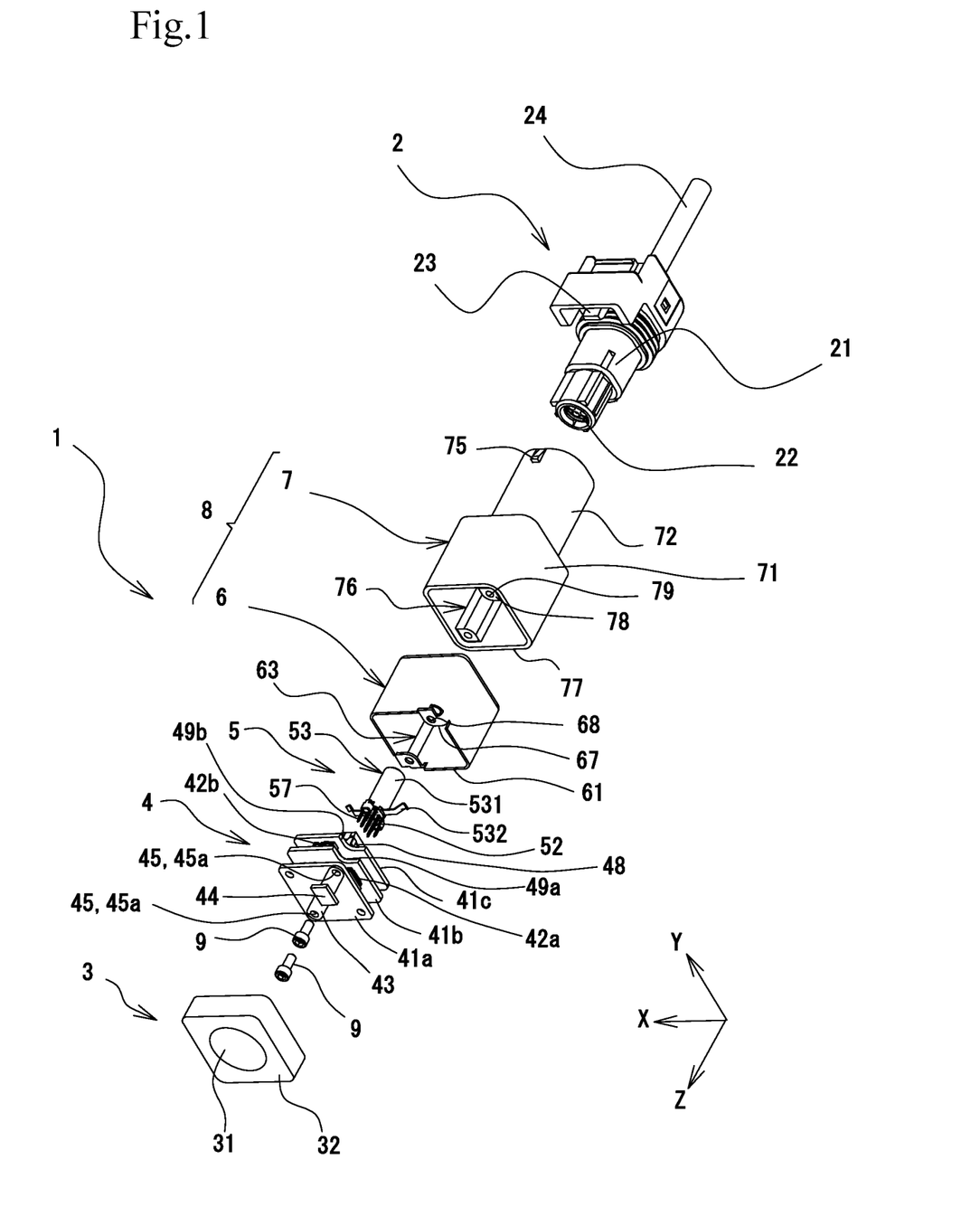
FIG. 1 is an exploded perspective view of an imaging apparatus according to an embodiment of the present invention.
Figure 2:
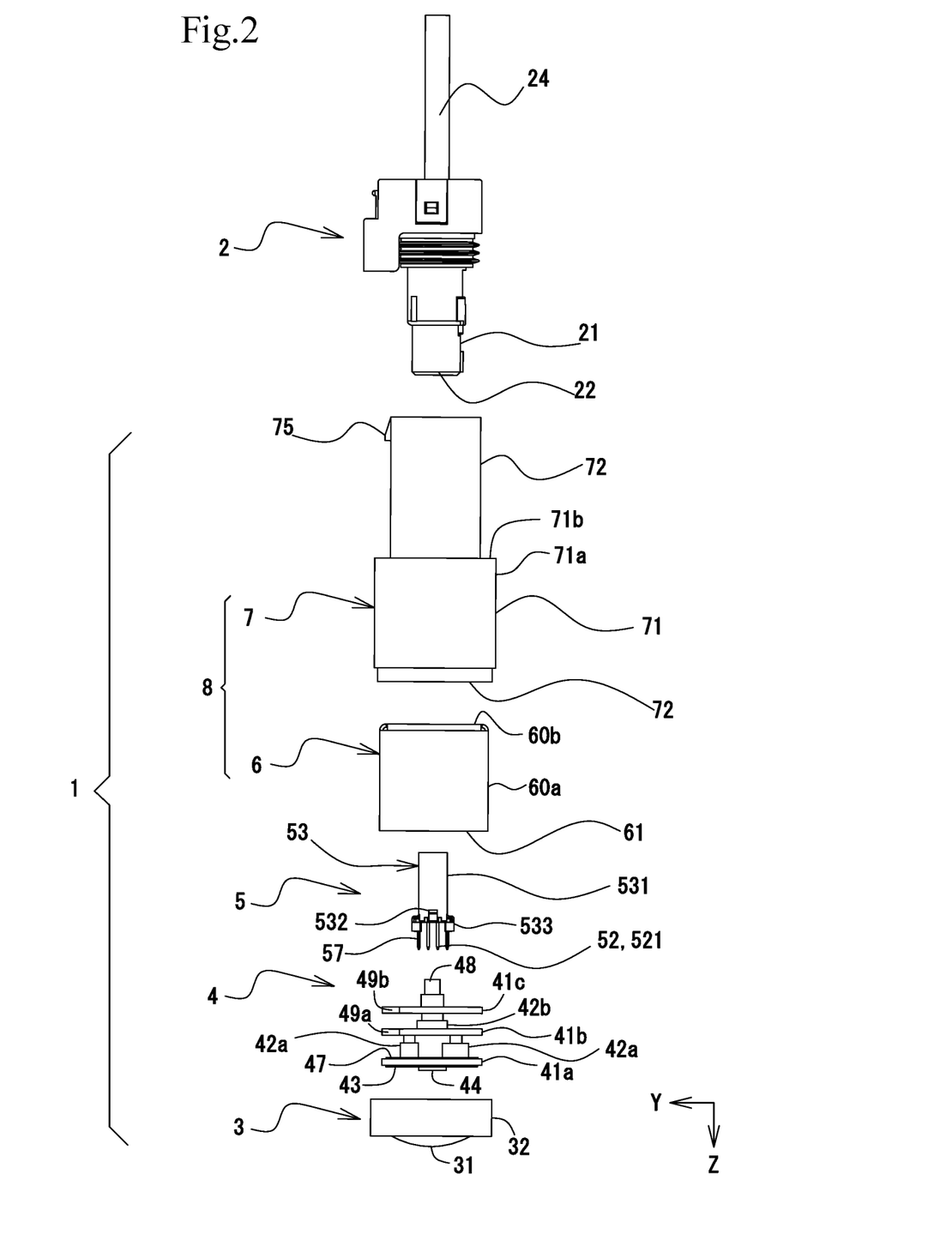
FIG. 2 is an exploded view of the imaging apparatus viewed in the direction X in FIG. 1.

An embodiment of the present invention will be described below with reference to drawings. In the present specification, the claims, and the drawings, the description will be made under the following definition: The direction X shown in FIG. 1 is the rightward/leftward direction of an imaging apparatus and components thereof; the direction Y shown in FIG. 1 is the frontward/rearward direction of the imaging apparatus and components thereof; and the direction Z in FIG. 1 is the optical axis direction, the height direction, and the upward/downward direction of the imaging apparatus and components thereof. It is noted, however, that the definition of the directions is not intended to limit the directions in which the imaging apparatus and other components of the present invention are implemented and used.
Configuration of Imaging Apparatus 1

An imaging apparatus 1 includes a housing 8, the front side of which forms an opening 81, an imaging circuit unit 4 which serves as an "electronic circuit unit" provided in the housing 8, a lens unit 3 which is attached to the opening 81 of the housing 8, a connector 5 for external connection which is provided in the housing 8 and connects the imaging circuit unit 4 to an external apparatus, and fixing members 9 which fix the imaging circuit unit 4 in the housing 8.

The housing 8 includes an outer frame member 7 and an inner frame member 6 formed of a box-shaped metal shell as an "enclosure section shielding body" which is so provided in the outer frame member 7 as to be in intimate contact therewith. The inner frame member 6 is so formed in insert molding with the inner frame member 6 inserted into the outer frame member 7, and the housing 8 is therefore formed as a molded body formed of the outer frame member 7 and the inner frame member 6 integrated with each other.

It is preferable that the outer frame member 7 is formed of a resin molded body, and that a thermally conducive resin having a thermal conductivity ranging from 1 to 20 W/mK is used as the resin material of the resin molded body to achieve satisfactory heat dissipation. A box-shaped section 71, which serves as an "enclosure section," is formed on a front portion of the outer frame member 7, and a tubular section 72, which serves as a "connector section," is formed on a rear portion of the outer frame member 7.

Figure 7:
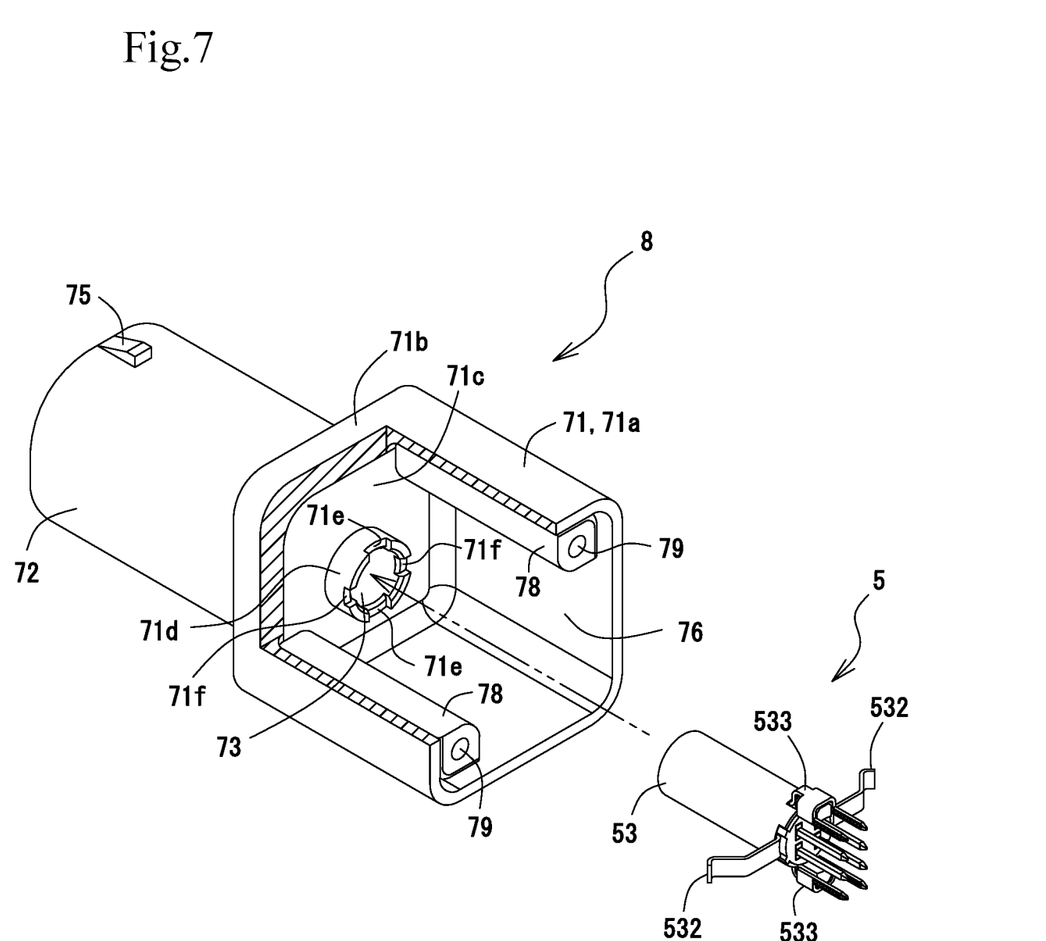
FIG. 7 is a perspective view of the housing in FIG. 1 with part thereof cut off.
Figure 8:
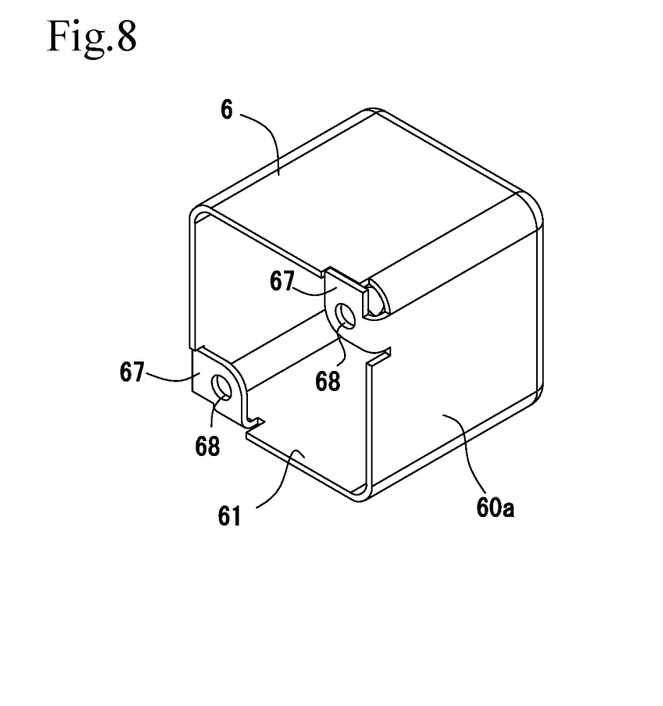
FIG. 8 is a perspective view including the front surface, the right side surface, and the plan surface of an inner frame member in FIG. 1.
Figure 9:
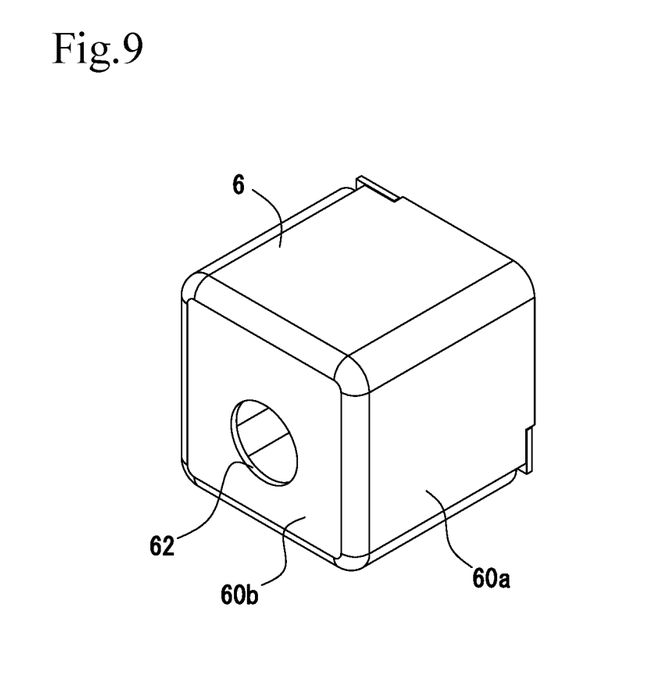
FIG. 9 is a perspective view including the rear surface, the right side surface, and the plan surface of the inner frame member in FIG. 1.
Figure 10:
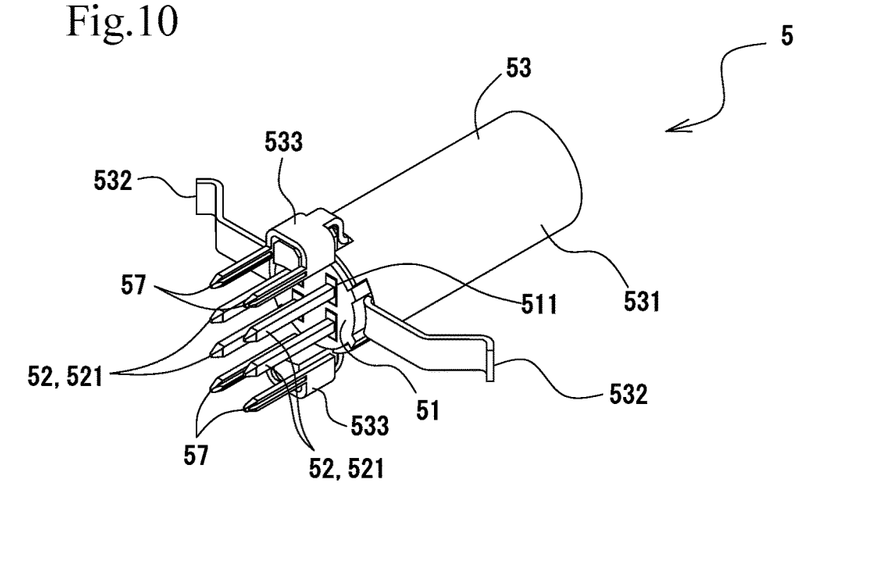
FIG. 10 is a perspective view including the front surface, the right side surface, and the plan surface of a connector for external connection in FIG. 1.
Figure 11:
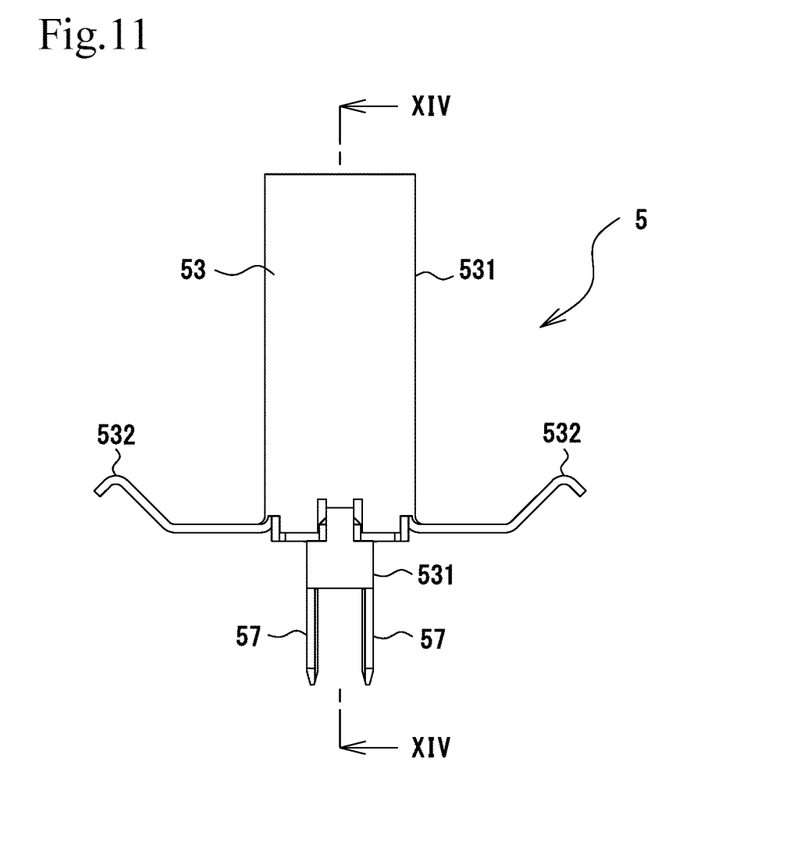
FIG. 11 is a plan view of the connector for external connection.
Figure 12:
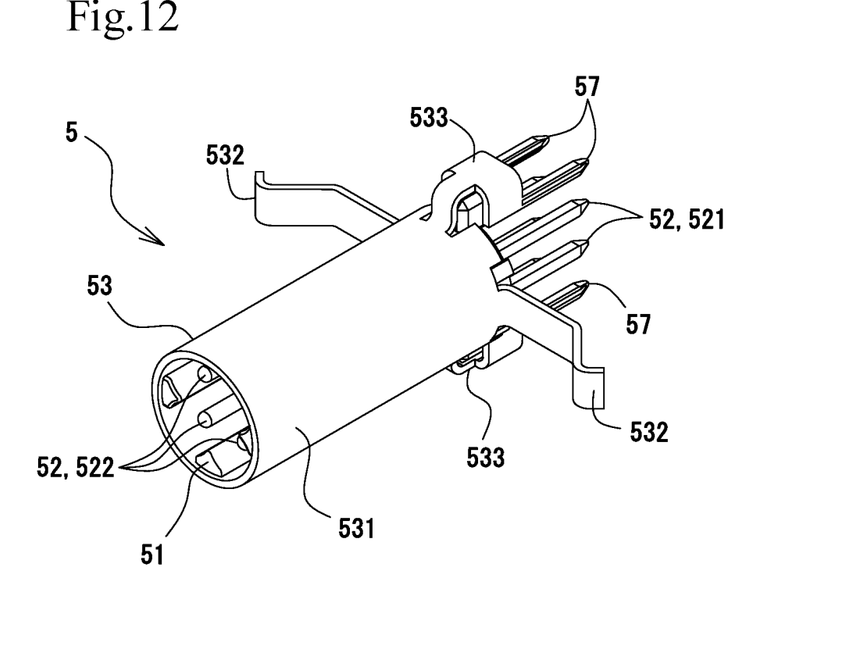
FIG. 12 is a perspective view including the rear surface, the left side surface, and the plan surface of the connector for external connection in FIG. 1.
Figure 13:
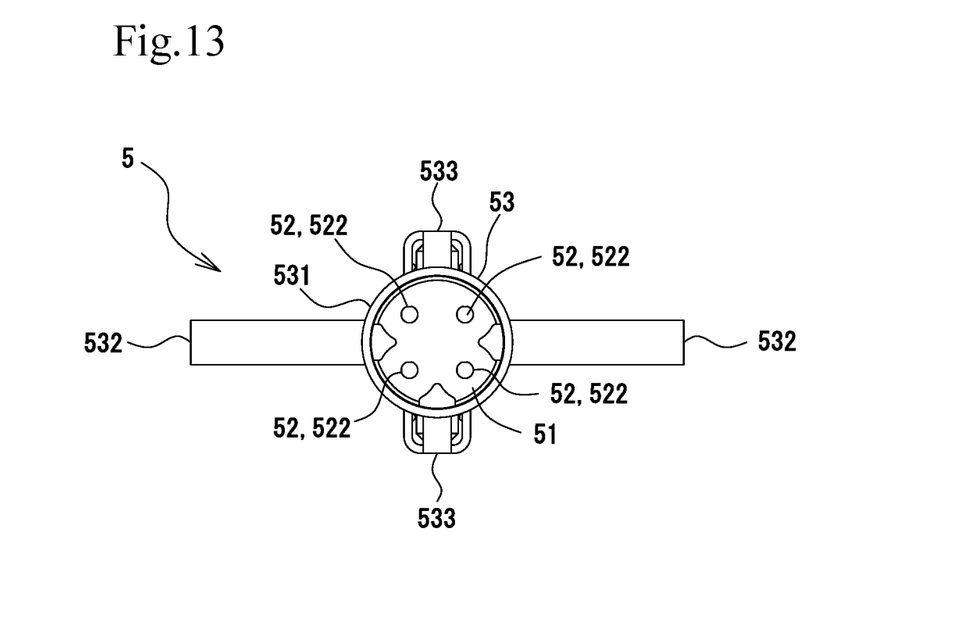
FIG. 13 is a rear view of the connector for external connection in FIG. 1.
Figure 14:
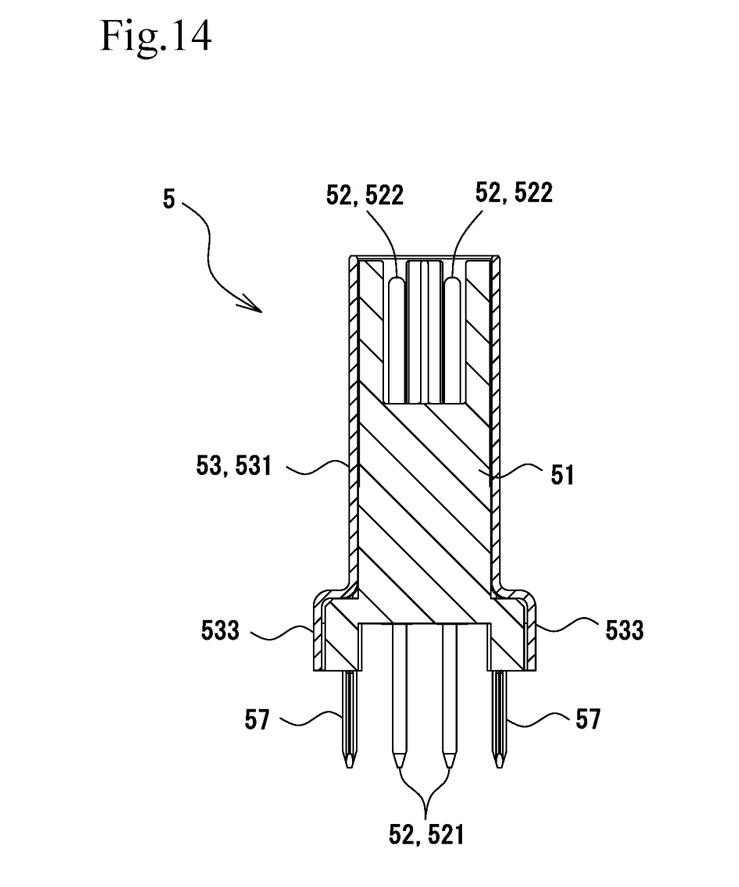
FIG. 14 is a cross-sectional view taken along the line XIV-XIV in FIG. 11.

The box-shaped section 71 has a tubular circumferential wall 71a with an opening 77 formed on the front side of the box-shaped section 71 and a bottom wall 71c, which is formed of a barrier wall 71b, formed on the rear side of the box-shaped section 71 of the side opposite the front side thereof, so that the box-shaped section 71 has a rectangular box-like shape as a whole. The interior of the box-shaped section 71 forms a cavity 76, which accommodates the inner frame member 6. Columnar sections 78, which each extend along the direction Z, are provided at two opposing corners of the cavity 76. A threaded hole 79, which engages with a fixing member 9, is formed in each of the columnar section 78. A tubular support wall 71d, which is provided along a hole edge of a first insertion hole 73, which will be described later, is formed on the bottom wall 71c. The tubular support wall 71d is a cylindrical resin wall, and first recesses 71e and second recesses 71f are formed in the outer circumference of the tubular support wall 71d. Positioning protrusions 533, which are provided at a pin shield 53, which will be described later, are fitted in the first recesses 71e, and contact pieces 532 enter the second recesses 71f in such a way that the contact pieces 532 are elastically deformable (see FIG. 7). The tubular support wall 71d also functions as a barrier wall that prevents the pin shield 53, which will be described later, from coming into contact with and rubbing against the inner frame member 6 when the pin shield 53 is inserted into the first insertion hole 73. If the pin shield 53 rubs against the inner frame member 6 when inserted into the first insertion hole 73, metal residues that cause a short circuit are produced, but the thus functioning tubular support wall 71d can prevent the metal residues from being produced.

The tubular section 72 is formed in a cylindrical shape, and the first insertion hole 73, which passes through the barrier wall 71b and communicates with the cavity 76 and into which the connector 5 for external connection is inserted and attached, is formed on the front side of the tubular section 72. On the other hand, a second insertion hole 74, which communicates with the first insertion hole 73 and into which a socket 21 of a relay connector 2 is insertable, is formed on the rear side of the tubular section 72. A locking claw 75, which is a protrusion for locking the relay connector 2, is formed on an outer circumferential portion of the tubular section 72.

The inner frame member 6, which serves as the "enclosure section shielding body," is formed in a bottomed tubular shape having a circumferential wall section 60a, which covers the tubular circumferential wall 71a of the box-shaped section 71, and a bottom wall section 60b, which covers the bottom wall 71c of the box-shaped section 71. The inner frame member 6 is made of a metal material that excels in thermal conductivity, such as aluminum and a copper alloy. The front side of the inner frame member 6 forms an opening 61. A cavity 63 is formed in the inner frame member 6. A third insertion hole 62, which communicates with the cavity 63 and into which the connector 5 for external connection is insertable, is formed in the bottom wall section 60b. Attachment plates 67, which each protrude in the form of an inward flange toward the interior of the cavity 63, are formed at a pair of opposing corners of the opening 61 of the inner frame member 6. An attachment hole 68, into which the fixing members 9 is inserted, is formed in each of the attachment plates 67. The inner frame member 6 is so formed in insert molding with the inner frame member 6 inserted into the outer frame member 7 to form an integrated molded body. The surface of the outer frame member 7 and the surface of the inner frame member 6 are in intimate contact with each other with no gap therebetween, whereby satisfactory thermal conductivity between the two members is achieved.

The imaging circuit unit 4 includes substrate 41a, 41b, and 41c, which have a variety of electric elements and circuit wiring lines, a connector 42a, which connects the substrates 41a and 41b to each other, a connector 42b, which connects the substrates 41b and 41c to each other, an imaging element 44, which is mounted on the substrate 41a, and a relay connector 48.

The substrate 41a, 41b, and 41c are each a printed circuit board. Out of the three substrates, the substrate 41a has a front surface and a rear surface on which heat dissipating metal wiring lines 43 and 47 are formed as a "heat conducting section" and a "heat conducting path", respectively. The heat dissipating metal wiring lines 43 and 47 are each not a circuit wiring line that transmits an electric signal from the imaging element 44 but are each allowed to function as a ground circuit wiring line. Through holes 45, into which the fixing members 9 are inserted, are provided in the substrate 41a. In the present embodiment, a metal film that leads to the heat dissipating metal wiring line 43 is formed on the inner surface of each of the through holes 45. The metal films, along with the heat dissipating metal wiring lines 43 and 47, form the "heat conducting section" and the "heat conducting path" in the present invention. Cutouts 49a and 49b are formed in the substrates 41b and 41c, respectively. The cutouts 49a and 49b are so formed that the substrates 41b and 41c can be smoothly inserted into the inner frame member 6 and incorporated therein with no interference with the attachment plates 67. The relay connector 48, which achieves electrically continuous connection with the connector 5 for external connection, is provided on the substrate 41c. The relay connector 48 has the function of connecting the imaging circuit unit 4 to the external apparatus via the connector 5 for external connection. The housing of the relay connector 48 is provided with four socket terminals (not shown) corresponding to four pin terminals 52 of the connector 5 for external connection so that the socket terminals achieve electrically continuous connection with the pin terminals 52.

The imaging element 44 is an imaging device, such as a charge coupled device (CCD) and a complementary metal oxide semiconductor (CMOS) device, converts light guided through the lens unit 3 into an electric signal, and outputs the electric signal to the external apparatus.

The lens unit 3 is a member that is so fixed as to close the front-side opening 81 of the housing 8, and a lens 31, which guides light to the imaging element 44, is provided in a central portion of a plate-shaped main body section 32. The lens unit 3 can be attached to the housing 8 based on fitting, bonding, screw fixation, or any other arbitrary method. The main body section 32 is formed of a square plate-shaped resin molded body and is a non-light-transparent member that transmits no outside light. The lens 31 is a member that is made of a resin or glass material, collects outside light, and forms an image on the front surface of the imaging element 44. It is assumed that the lens 31 is integrated with the main body section 32 in insert molding in the present embodiment. The lens 31 may instead be bonded or otherwise attached to and integrated with the main body section 32.

The connector 5 for external connection achieves electrically conductive connection between the imaging circuit unit 4 and the external apparatus. The connector 5 for external connection has a plurality of pin terminals 52 (four pin terminals 52 in present embodiment), which are connected to the relay connector 48 of the imaging circuit unit 4, a housing 51, which serves as a "terminal holder" to which the pin terminals 52 are press-fitted and fixed, and the pin shield 53, which serves as a "connector section shielding body", and which is so fixed to the housing 51 as to cover the circumference of the housing 51 and the pin terminals 52. The housing 51 is press-fitted and fixed to the pin shield 53.

The pin terminals 52 are inserted into the socket terminals (not shown) of the relay connector 48 of the imaging circuit unit 4 to achieve electrically conductive connection therewith. The pin terminals 52 not only transmit an electric signal produced by the imaging circuit unit 4 but is used to supply electric power from the external apparatus to the imaging circuit unit 4. The housing 51 is a circular columnar resin molded body having terminal holding holes 511, to which the pin terminals 52 are press-fitted and fixed. The pin terminals 52 are press-fitted and fixed into the terminal holding holes 511, and internal connection pins 521, which serve as "internal contact sections" of the pin terminals 52, protrude from the front end of the housing 51. Further, external connection pins 522, which serve as "external contact sections" of the pin terminals 52, protrude from the rear end of the housing 51. The external connection pins 522 are covered with the cylindrical pin shield 53 and disposed in the internal space thereof. When the socket 21 of the relay connector 2 is inserted into the second insertion hole 74, a connection terminal 22 in the socket 21 is inserted into the pin shield 53, and the connection terminal 22 achieves electrically conductive connection with the external connection pins 522 in the pin shield 53. The fixation of the pin terminals 52 to the housing 51 does not necessarily based on press fitting and may instead be based on insert molding.

The pin shield 53 is a cylindrical metal molded body that electromagnetically shields the pin terminals 52 and includes a tubular main body 531 and the paired contact pieces 532, which are located at the front end of the tubular main body 531 and extend in the radial direction (+Y direction, −Y direction) with respect to the axis of the tubular pin shield 53. The contact pieces 532 are each formed as a spring piece that extends in the form of a cantilever from the tubular main body 531. The contact pieces 532, which are elastically deformed, can therefore achieve pressing contact with the bottom wall section 60b of the inner frame member 6. Since the contact pieces 532 are elastically deformed to achieve the pressing contact, the contact pieces 532 can reliably maintain the pressing contact with the inner frame member 6 even if the components of the imaging apparatus 1 are each positionally shifted by a small amount when the imaging apparatus 1 is assembled or due to impact or vibration acting on the imaging apparatus 1 in use.

The pin shield 53 is further provided with four pins 57 for ground connection, which protrude frontward.

The pin shield 53 has positioning protrusions 533, which are locking sections and protrude outward on its outer surface. The positioning protrusions 533 are fitted into the first recesses 71e of the tubular support wall 71d, which is formed on the bottom wall 71c of the box-shaped section 71, as described above. The pin shield 53 will therefore not rotate even if external force that rotates the pin shield 53 in the first insertion hole 73 acts on the pin shield 53 because the positioning protrusions 533 abut against the first recesses 71e, whereby the pin shield 53 will not loosen or fall off but can maintain the correct attachment state.

The fixing members 9 are each a screw made of a metal. When the fixing members 9 are inserted into the through holes 45 of the substrate 41a and the attachment holes 68 of the attachment plates 67 of the inner frame member 6 and engage with the threaded holes 79 of the columnar sections 78, the substrate 41a and the attachment plates 67 are sandwiched between the head portions of the screws, which form the fixing members 9, and the columnar sections 78, whereby the imaging circuit unit 4 can be fixed to the housing 8.

In the state in which the imaging circuit unit 4 and the housing 8 are fixed with the fixing members 9, the substrate 41a is in contact with the attachment plates 67 of the inner frame member 6 with the aid of fastening force produced by the fixing members 9. The "heat conducting path," in which the following components are linked to each other, is therefore formed in the imaging apparatus 1: the heat dissipating metal wiring line 43 of the substrate 41a, which is in contact with the imaging element 44; the metal films in the through holes 45 of the substrate 41a; the heat dissipating metal wiring line 47 on the substrate 41a; and the attachment plates 57 of the inner frame member 6, which is in contact with the heat dissipating metal wiring line 47. Further, the inner frame member 6 is in contact with the pin shield 53 via the contact pieces 532, and the tubular main body 531 of the pin shield 53 is in contact with a cable shield 25 made of a metal, of the relay connector 2. The "heat conducting path," in which metal materials are linked to each other, is thus formed from the imaging element 44 to the relay connector 2, whereby the heat of the imaging element 44 can be efficiently dissipated.

The imaging apparatus 1 described above is connected to the external apparatus via the relay connector 2. The relay connector 2 is a connector that connects the imaging apparatus 1 to the external apparatus and includes the socket 21, the connection terminal 22 which is provided in the socket 21, a locking claw 23 which is provided at the socket 21, a cable 24 which extends rearward from the socket 21, and a cable shield 25 made of a metal.

Figure 3:
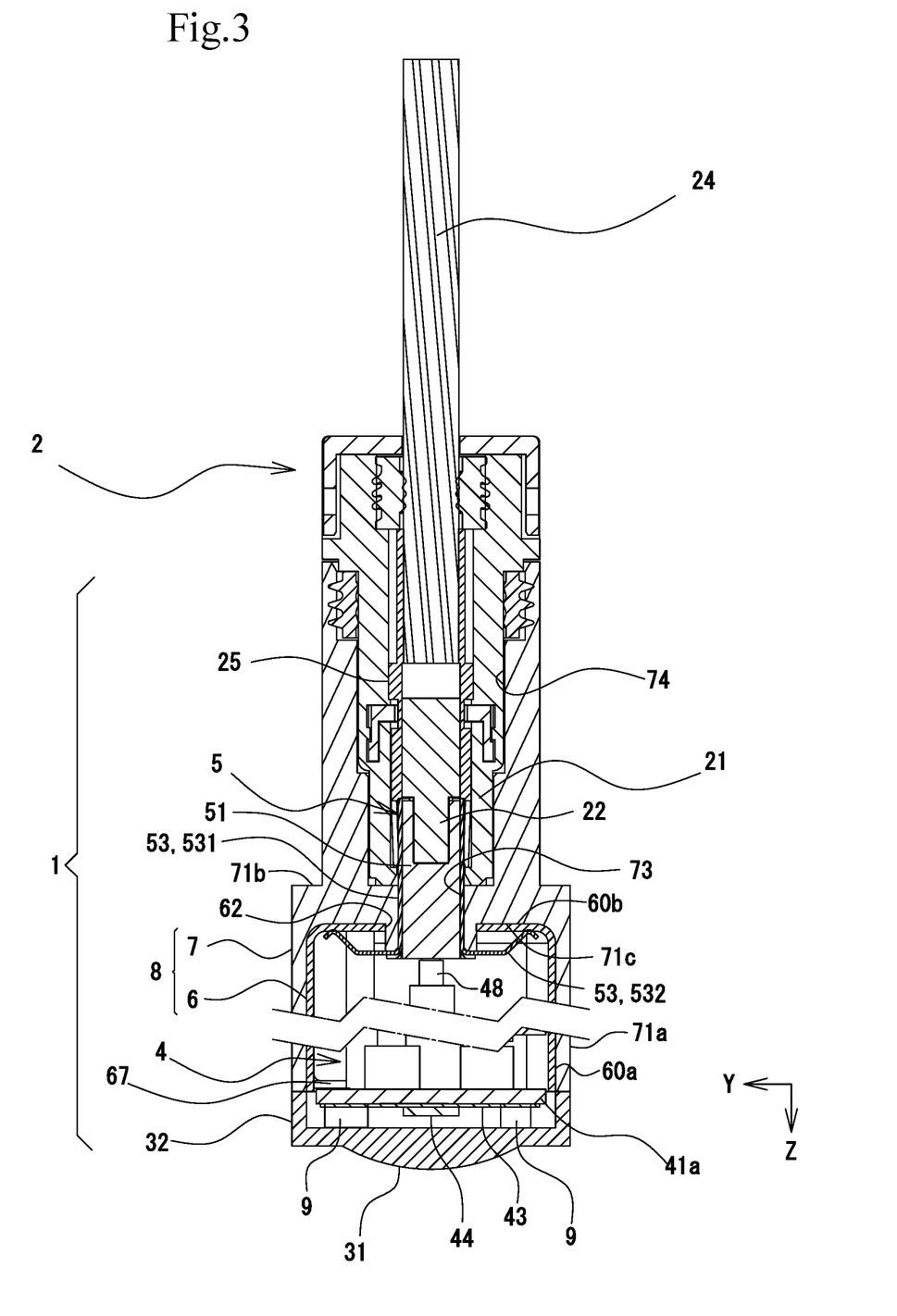
FIG. 3 is a central longitudinal section view of the imaging apparatus in FIG. 1 taken along the plane X-Z.
Figure 4:
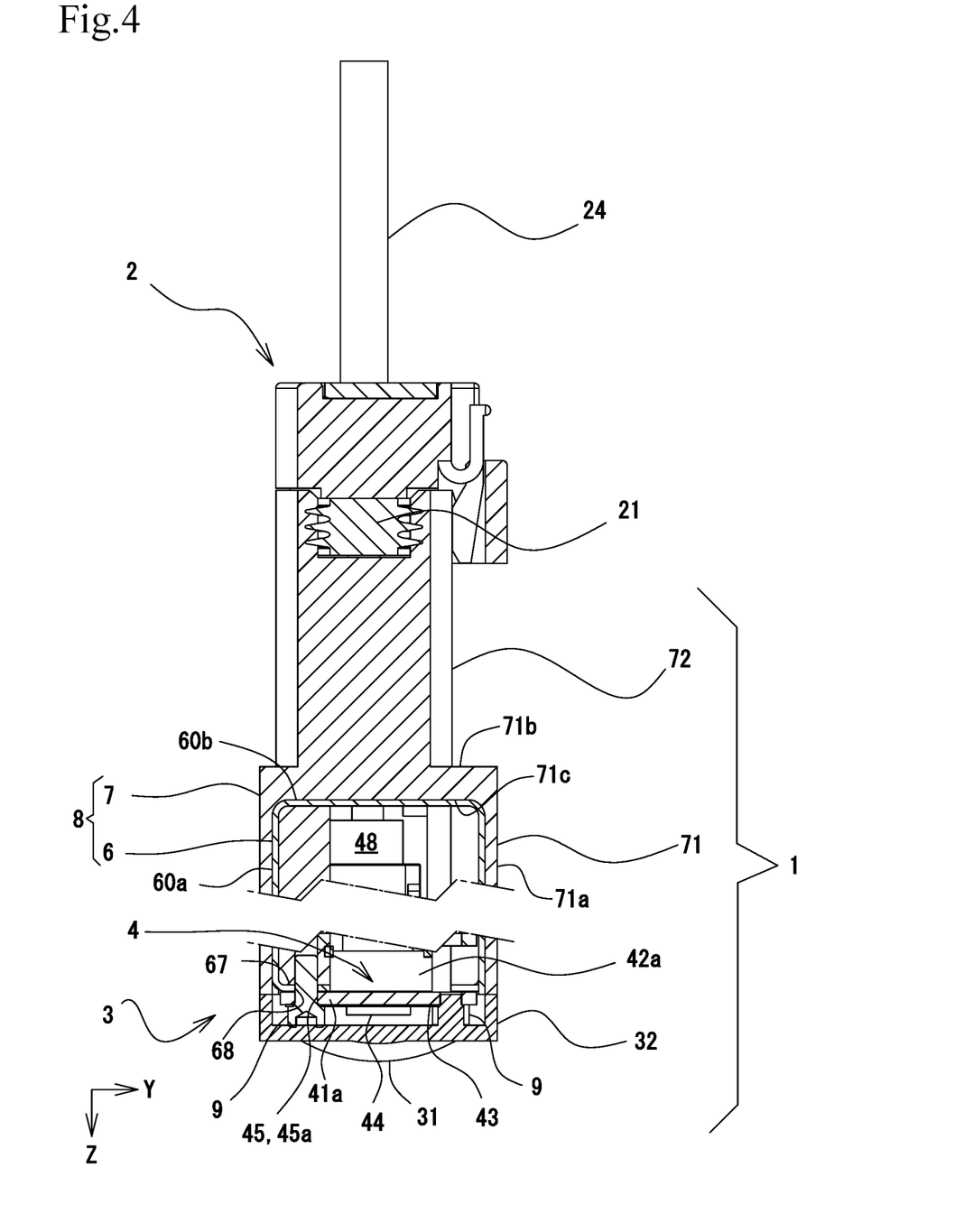
FIG. 4 is a longitudinal section view of the imaging apparatus in FIG. 1 taken along the plane Y-Z and containing the axis of a fixing member.
Figure 5:
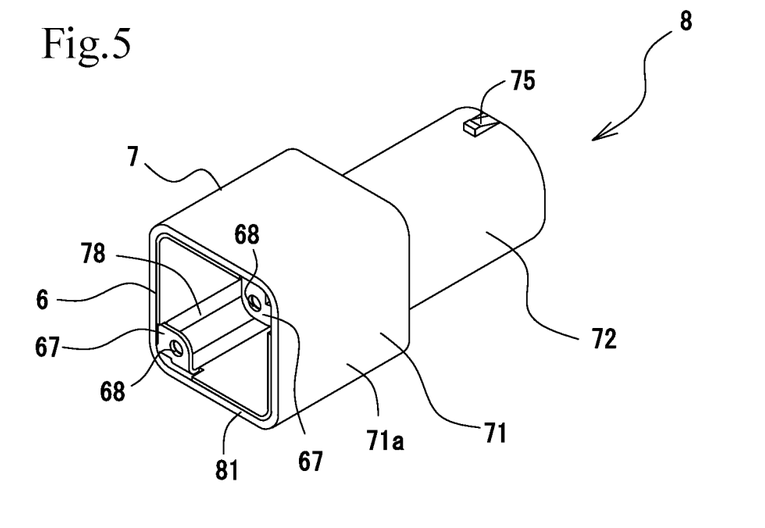
FIG. 5 is a perspective view including the front surface, the right side surface, and the plan surface of a housing in FIG. 1.
Figure 6:
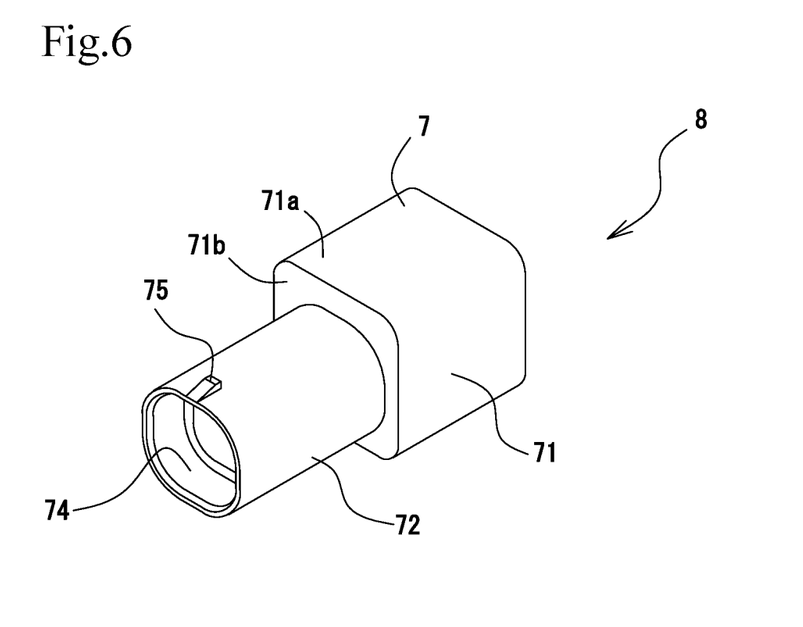
FIG. 6 is a perspective view including the rear surface, the left side surface, and the plan surface of the housing in FIG. 1.

The socket 21 is formed of a tubular resin molded body and has an outer shape that can be inserted into the second insertion hole 74, which is formed in the tubular section 72 of the housing 8. The connection terminal 22 achieves electrically continuous connection with the pin terminals 52 of the connector 5 for external connection of the imaging apparatus 1. The locking claw 23 engages with the locking claw 75, which is formed on the outer circumferential portion of the tubular section 72, so that the relay connector 2 does not fall off the interior of the tubular section 72. The cable 24 is a coaxial cable that transmits the electric signal produced by the imaging circuit unit 4 to the external apparatus, and lead wires corresponding to the number of pin terminals 52 are contained in the cable 24. Sockets, terminals, and other components for connection with the external apparatus are provided at an end of the relay connector 2 that is opposite to the imaging apparatus 1. The cable shield 25 electromagnetically shields the portion from a base end portion of the connection terminal 22, which is inserted into the tubular main body 531 of the pin shield 53, to a front-end-side portion of the cable 24 (FIG. 3) and is formed of a cylindrical metal member. When the relay connector 2 is connected to the imaging apparatus 1, the front end of the cable shield 25 abuts against the front end of the pin shield 53 so that the front ends are in contact with each other. The connection described above between the relay connector 2 and the imaging apparatus 1 allows transmission of an electric signal produced by the imaging apparatus 1 to the external apparatus.

Advantageous Effects of Imaging Apparatus 1

Advantageous effects of the imaging apparatus 1 according to the present embodiment will be described except those having been described.

In the imaging apparatus 1, the heat generated by the imaging element 44 is transferred via the heat dissipating metal wiring line 43, the metal films 45a in the through holes 45, and the heat dissipating metal wiring line 47 to the inner frame member 6, and then from the inner frame member 6 to the outer frame member 7. The heat dissipating metal wiring line 43, the metal films 45a in the through holes 45, the heat dissipating metal wiring line 47, and the inner frame member 6 are each made of a metal material and therefore have satisfactory thermal conductivity. The outer frame member 7 is also made of a thermally conductive resin and therefore has satisfactory thermal conductivity. That is, the thermally conductive path from the imaging element 44 to the outer frame member 7 has satisfactory thermal conductivity and can transfer the heat generated by the imaging element 44 to the outer frame member 7 and dissipate the heat via the outer frame member 7 to the atmosphere. The heat in the imaging circuit unit 4 can therefore be effectively dissipated.

The heat transferred to the inner frame member 6 is also transferred to the pin shield 53, which is made of a metal and is in contact with the inner frame member 6 via the contact pieces 532, and the heat is also transferred out of the box-shaped section 71 of the housing 8 via the pin shield 53 to the tubular section 72. The heat is therefore not accumulated in the box-shaped section 71 of the housing 8 but can be dissipated. Further, the heat transferred to the pin shield 53 is also transferred to the cable shield 25 because the front end of the pin shield 53 abuts against the front end of the cable shield 25, which is made of a metal, of the relay connector 2. The heat transferred to the inner frame member 6 can therefore be transferred also to the components of the relay connector 2 via the cable shield 25 and dissipated from the relay connector 2.

The imaging circuit unit 4 is covered with the circumferential wall section 60a and the bottom wall section 60b of the inner frame member 6 made of a metal. Therefore, the imaging circuit unit 4 is shielded against external electromagnetic waves and can effectively prevent generation of noise resulting from the electromagnetic waves. Further, the pin terminals 52 of the connector 5 for external connection are so configured that portions thereof fixed with respect to the terminal holding holes 511 and the external connection pins 522 are covered with the tubular main body 531 of the pin shield 53. The section that achieves electrically continuous connection with the relay connector 2, which leads to the external apparatus, can also be reliably shielded against electromagnetic waves.

Further, the inner frame member 6 and the pin shield 53 are formed separately from each other and are ideally preferably formed as an integrated member from the viewpoint of the electromagnetic shielding. The tubular main body 531 of the pin shield 53, however, passes through the bottom wall section 60b of the inner frame member 6 with an end portion of the tubular main body 531 located in the inner frame member 6, and the tubular main body 531 therefore overlaps with the inner frame member 6, so that no gap is present therebetween in the Z direction. The inner frame member 6 and the pin shield 53, which are separate members, can therefore reliably provide electromagnetic shielding.

Since the pin shield 53 accommodates the housing 51 and the pin terminals 52, the connector 5 for external connection can be handled as a part, whereby the connector 5 for external connection can be readily handled in the steps of manufacturing the imaging apparatus.

Variations of Embodiment

The present invention is not limited to the embodiment described above and can be implemented in a variety of variations. Examples of the variations will be described.

The embodiment described above shows the case where the fixing members 9 are caused to engage with the threaded holes 79 of the columnar sections 78 of the outer frame member 7 to fix the imaging circuit unit 4 including the substrate 41a and other components. Instead, as a form in which no columnar sections 78 are provided and no threaded holes 79 are therefore present, the fixing members 9 may each be formed of a bolt and a nut, which may engage with each other to fix the substrate 41a and the inner frame member 6. The fixing members 9 of this form can similarly form the heat conducting path from the imaging element 44 to the inner frame member 6. Further, in the case where the fixing members 9 are each a screw made of a metal and in the state in which the fixing members 9 engage with the threaded holes 79, the fixing members 9 are allowed to serve as a component of the heat conducting path by causing the head portions of the screws, which form the fixing members 9, to be in contact with the heat dissipating metal wiring line 43 and the shaft portions of the screws to be in contact with the attachment holes 68 of the inner frame member 6.

The fixing members 9 may instead be a thermally conductive adhesive. In this case, the thermally conductive adhesive is continuously applied to the portion from the heat dissipating metal wiring line 43 via the through holes 45 to the heat dissipating metal wiring line 47 and the inner frame member 6, whereby a thermally conductive path ranging from the heat dissipating metal wiring line 43 to the inner frame member 6 can be formed.

In the embodiment described above, the case where the contact pieces 532 are each a spring piece has been presented. The contact pieces 532 are not each necessarily a spring piece and can instead each be a plate piece that is in contact with the inner frame member 6. The contact piece in the variation cannot, of course, provide the advantageous effect provided by the contact pieces 532 each formed of a spring piece.

In the embodiment described above, the case where the imaging circuit unit 4 includes the three substrate 41a, 41b, and 41c has been presented, but the number of substrates is not limited to three. Further, the connectors 42a and 42b are used to achieve inter-substrate electrically continuous connection but are only an example that achieves the inter-substrate electrically continuous connection, and other means may be used to achieve the inter-substrate electrically continuous connection. The configuration of the imaging circuit unit 4 is not limited to that shown in the present embodiment by way of example, and the imaging circuit unit may instead be formed of a single substrate, the imaging element 44 and the heat dissipating metal wiring line 43 mounted on the substrate, through holes formed in the substrate and used to fix the imaging circuit unit with the aid of the fixing members 9, and the relay connector 48 disposed on the rear surface of the substrate. The number of substrates to be used may, of course, be any number, such as two and four.

REFERENCE SIGNS LIST

1: Imaging apparatus
2: Relay connector
21: Socket
22: Connection terminal
23: Locking claw
24: Cable
25: Cable shield
3: Lens unit
31: Lens
32: Main body section
4: Imaging circuit unit (electronic circuit unit)
41a, 41b, 41c: Substrate
42a, 42b: Connector
43: Heat dissipating metal wiring line (heat conducting section)
44: Imaging element
45: Through hole
45a: Metal film
47: Heat dissipating metal wiring line (heat conducting section)
48: Relay connector
49a, 49b: Cutout
5: Connector for external connection
51: Housing (terminal holder)
511: Terminal holding hole
52: Pin terminal (connector terminal)
521: Internal connection pin (internal contact section)
522: External connection pin (external contact section)
53: Pin shield (connector section shielding body)
531: Tubular main body
532: Contact piece
533: Positioning protrusion (locking section)
57: Pin for ground connection
6: Inner frame member (enclosure section shielding body)
60a: Circumferential wall section
60b: Bottom wall section
61: Opening
62: Third insertion hole
63: Cavity
67: Attachment plate
68: Attachment hole
7: Outer frame member (enclosure section)
71: Box-shaped section (enclosure section)
71a: Tubular circumferential wall
71b: Barrier wall
71c: Bottom wall
71d: Tubular support wall
71e: First recess
71f: Second recess
72: Tubular section (connector section)
73: First insertion hole
74: Second insertion hole
75: Locking claw
76: Cavity
77: Opening
78: Columnar section
79: Threaded hole
8: Housing
81: Opening
9: Fixing member

The invention claimed is:

1. Parts for an imaging apparatus comprising a housing that accommodates an electronic circuit unit including an imaging element,
wherein the housing includes an outer frame member and an inner frame member that is made of a metal, is provided on an inner surface of the outer frame member, and accommodates the electronic circuit unit, and wherein the parts for the imaging apparatus further comprise a fixing member that fixes the electronic circuit unit to the housing, a substrate having the imaging element and a first heat dissipating metal wiring line on a surface of the substrate, and a heat conducting section configured to transmit heat generated by the imaging element to the inner frame member when the fixing member fixes the electronic circuit unit to the housing and the heat dissipating metal wiring line is in contact with the inner frame member.

2. The parts for an imaging apparatus according to claim 1, wherein the heat conducting section is a heat conducting path made of a metal that is provided on the substrate and that is in contact with the imaging element and the inner frame member.

3. The parts for an imaging apparatus according to claim 2, wherein the heat conducting path is provided on the substrate and formed of the heat dissipating metal wiring line that is in contact with the imaging element, a second heat dissipating metal wiring line that is in contact with the inner frame member, and a metal film that links the heat dissipating metal wiring lines to each other.

4. An imaging apparatus comprising the parts for an imaging apparatus according to claim 1.

* * * * *